United States Patent
Vashchenko et al.

(12) 
(10) Patent No.: US 6,653,716 B1
(45) Date of Patent: Nov. 25, 2003

(54) VARACTOR AND METHOD OF FORMING A VARACTOR WITH AN INCREASED LINEAR TUNING RANGE

(75) Inventors: Vladislav Vashchenko, Fremont, CA (US); Pascale Francis, Cupertino, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/866,148

(22) Filed: May 24, 2001

(51) Int. Cl.⁷ .................... H01L 29/93; H01L 29/76; H01L 29/94; H01L 31/062; H01L 31/113

(52) U.S. Cl. .................. 257/596; 257/344; 257/408; 257/595

(58) Field of Search .................. 257/344, 408, 257/595, 596, 597, 598, 599, 600, 601, 602

(56) References Cited

U.S. PATENT DOCUMENTS 5,338,966 A * 8/1994 Kasahara .............. 257/597
6,225,674 B1 * 5/2001 Lim et al. .............. 257/506
6,320,474 B1 * 11/2001 Kamiya et al. .............. 331/177

* cited by examiner

*Primary Examiner*—Ngân V. Ngô
(74) *Attorney, Agent, or Firm*—Mark C. Pickering (57) ABSTRACT

The linear tuning range of a semiconductor varactor is substantially increased by forming a lightly-doped drain region of a first conductivity type in a semiconductor material of a second conductivity type between a heavily-doped diffusion of the second conductivity type and a lower-plate region of the semiconductor material.

23 Claims, 8 Drawing Sheets

Q-FACTOR defined as Im(Y11)/Re(Y11)

VARACTOR AND METHOD OF FORMING A VARACTOR WITH AN INCREASED LINEAR TUNING RANGE

BACKGROUND OF THE INVENTION

1. Field of the Invention

The present invention relates to semiconductor varactors and, more particularly, to a varactor and a method of forming a varactor with an increased linear tuning range.

2. Description of the Related Art

A varactor is a semiconductor device that has a voltage-controlled capacitance. As a result, the capacitance across the device varies as the voltage across the device varies. Varactors are commonly used in the voltage-controlled oscillator (VCO) circuits of phase-locked loops (PLLs) which, in turn, are commonly used in high-frequency applications, such as with cellular phones.

Figure 1:
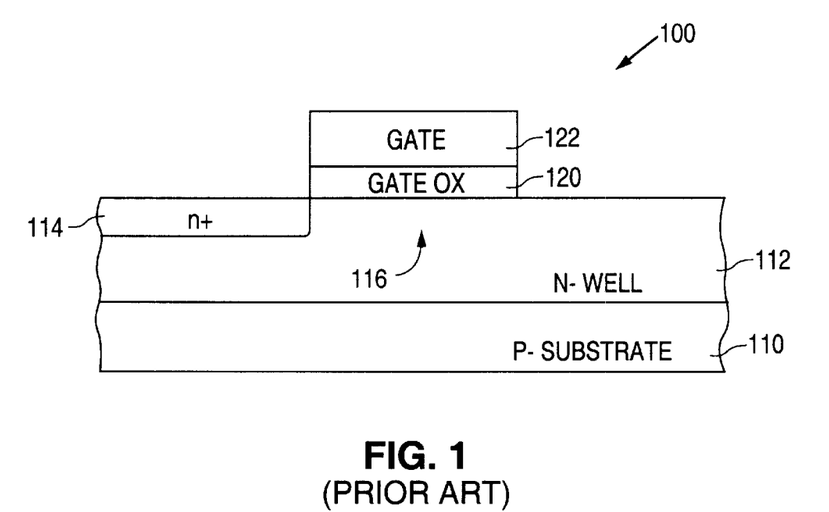
FIG. 1 is a cross-sectional diagram illustrating a conventional NMOS varactor 100.

FIG. 1 shows a cross-sectional diagram that illustrates a conventional NMOS varactor 100. As shown in FIG. 1, varactor 100, which is formed in a p– substrate 110, includes a n– well 112 that is formed in substrate 110, and an n+ diffusion region 114 which is formed in n– well 112. N-well 112, in turn, is defined to have a lower-plate region 116 that adjoins n+ diffusion region 114. In addition, varactor 100 also includes a layer of gate oxide 120 that is formed on n– well 112 over lower-plate region 116, and an upper-plate gate 122 that is formed on gate oxide layer 120.

Figure 2:
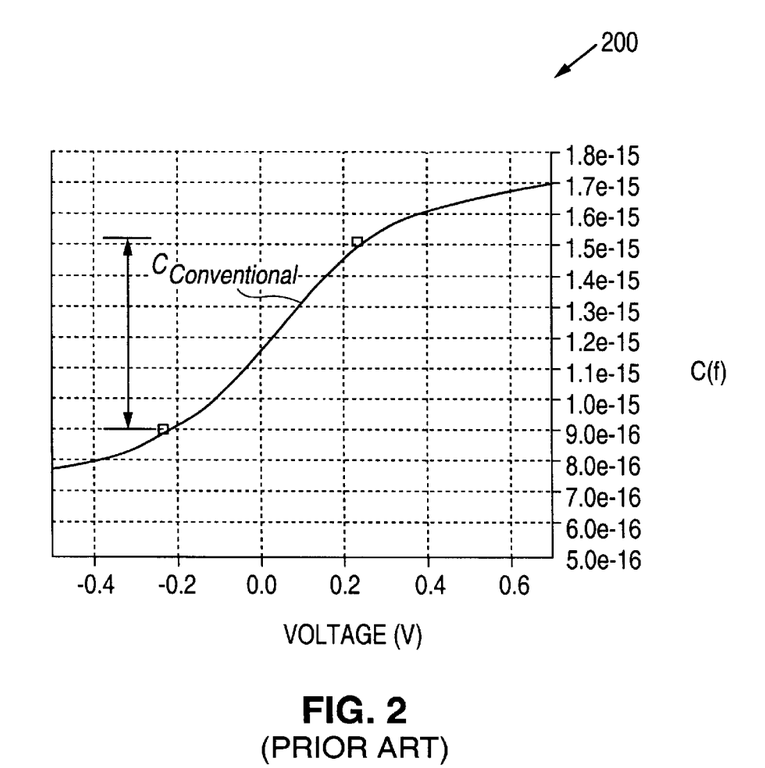
FIG. 2 is a graph 200 illustrating the operation of varactor 100.

FIG. 2 shows a graph 200 that illustrates the operation of varactor 100. Graph 200 utilizes a line $C_{CONVENTIONAL}$ to identify the capacitance (C) across varactor 100 for a voltage V across varactor 100. As shown in FIG. 2, when the voltage V across varactor 100 ranges from a negative value to a positive value, the capacitance C across varactor 100 increases. For example, when ground is applied to n+ diffusion region 114 and a voltage ranging from –0.5V to +0.7 is applied to gate 122, the capacitance C increases from approximately $7.7 \times 10^{-16}$ farads to approximately $1.7 \times 10^{-15}$ farads.

In addition, as further shown in FIG. 2, varactor 100 also has a substantially linear region of operation. For example, when ground is applied to n+ diffusion region 114 and a voltage ranging from –0.25V to +0.25V is applied to gate 122, the capacitance C substantially linearly increases from approximately $9.0 \times 10^{-16}$ farads to approximately $1.5 \times 10^{-15}$ farads as shown by line $C_{CONVENTIONAL}$.

Figure 3A:
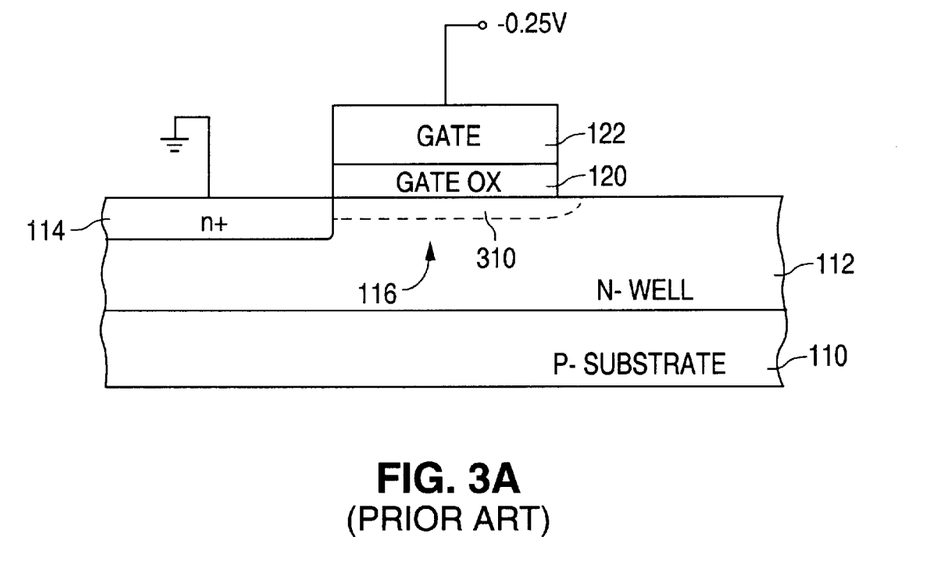
FIGS. 3A–3B are cross-sectional diagrams illustrating the operation of varactor 100 at the linear endpoints.
Figure 3B:
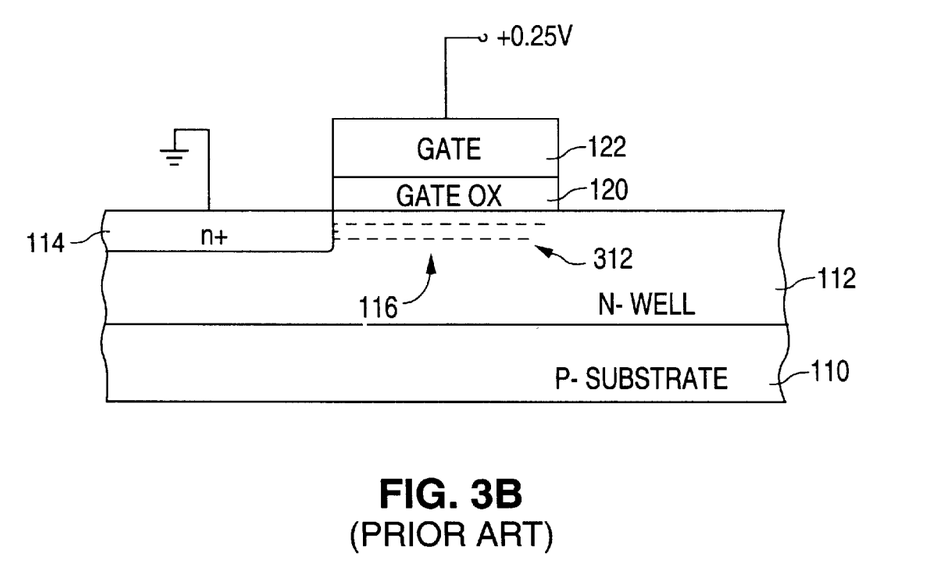

FIGS. 3A–3B shows cross-sectional diagrams that illustrate the operation of varactor 100 at the linear endpoints. As shown in FIG. 3A, when ground is applied to n+ diffusion region 114 and the lower linear endpoint of –0.25V is applied to upper-plate gate 118, the negative voltage causes a depletion region 310 to be formed in the lower-plate region 116 of n– well 112. The capacitance of varactor 100 in this condition is defined by the thickness of gate oxide layer 120 and the charge on lower-plate region 116 which, in turn, is defined by depletion region 310.

By contrast, as shown in FIG. 3B, when ground is applied to n+ diffusion region 114 and the upper linear endpoint of +0.25V is applied to upper-plate gate 118, the positive voltage causes a negative charge 312 to collect (or accumulate) in the lower-plate region 116 of n– well 112. Thus, as shown in FIGS. 3A and 3B, the capacitance of varactor 100 varies with the voltage across varactor 100 because as the voltage on gate 122 is varied, the charge level present in the lower-plate region 116 of n– well 112 also varies.

One of the advantages of varactor 100 is that varactor 100 can easily be integrated into a standard CMOS or BiCMOS fabrication process. N– well 112 can be formed at the same time that the wells for the PMOS transistors are formed, while n+ diffusion region 114 can be formed at the same time that the source and drain regions for the NMOS transistors are formed. In addition, gate oxide layer 120 and gate 122 can be formed at the same time that the oxide layer and MOS gates are formed.

One of the disadvantages of varactor 100 is that varactor 100 provides a relatively small linear tuning range, ranging only from approximately $9.0 \times 10^{-16}$ farads to approximately $1.5 \times 10^{-15}$ farads. If a greater or lesser amount of capacitance is required, a more complicated structure is required. As a result, there is a need for a varactor with a larger linear tuning range that remains easily integratable into a standard CMOS or BiCMOS fabrication process.

SUMMARY OF THE INVENTION

The present invention provides a varactor and a method of forming a varactor with an increased linear tuning range that remains easily integratable into a standard CMOS or BiCMOS fabrication process. The varactor of the present invention includes a first semiconductor material of a first conductivity type that has a lower-plate region.

The varactor also includes a first diffusion region of a second conductivity type that is formed in the first semiconductor material. The first diffusion region adjoins the lower-plate region. The varactor further includes a second diffusion region of the first conductivity type that is formed in the first semiconductor material. The second diffusion region adjoins the first diffusion region, and has a dopant concentration that is greater than a dopant concentration of the first semiconductor material.

The varactor of the present invention additionally includes a layer of insulation material that is formed on the first semiconductor material, and a varactor gate that is formed on the layer of insulation material over the lower-plate region.

The present invention also provides a method of forming a varactor in a first semiconductor material of a first conductivity type that has a lower-plate region. The method includes the steps of forming a layer of isolation material over the first semiconductor material, and forming a layer of first material over the layer of isolation material.

The method further includes the steps of etching the layer of first material to form a varactor gate on the layer of isolation material over the lower-plate region, and forming a first diffusion region in the first semiconductor material to adjoin the lower-plate region. The first diffusion region has a second conductivity type.

The method additionally includes the steps of forming a spacer over the first diffusion region that adjoins the varactor gate, and forming a second diffusion region in the first semiconductor material to adjoin the first diffusion region. The second diffusion region has the first conductivity type and a dopant concentration that is greater than a dopant concentration of the first semiconductor material.

A better understanding of the features and advantages of the present invention will be obtained by reference to the following detailed description and accompanying drawings that set forth an illustrative embodiment in which the principles of the invention are utilized.

DETAILED DESCRIPTION

Figure 4:
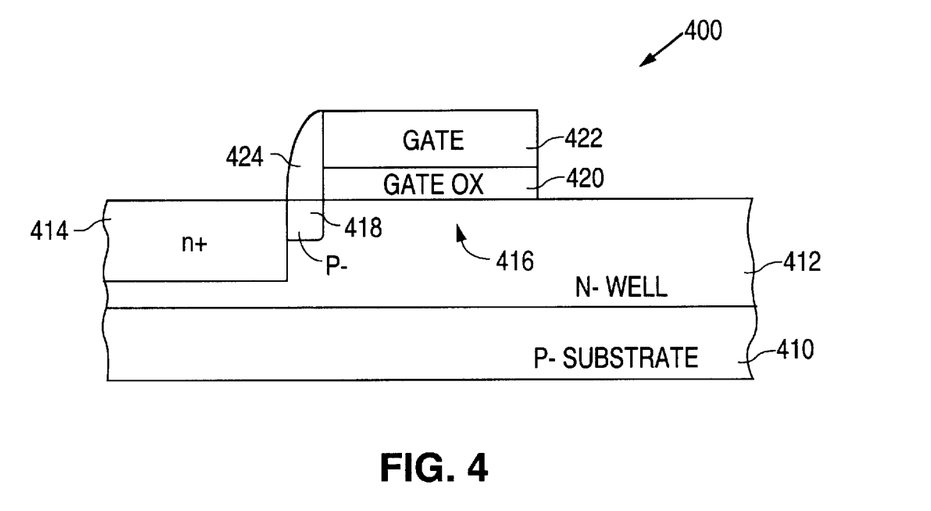
FIG. 4 is a cross-sectional diagram illustrating a varactor 400 in accordance with the present invention.

FIG. 4 shows a cross-sectional diagram that illustrates a varactor 400 in accordance with the present invention. As shown in FIG. 4, varactor 400, which is formed in a p– material 410, includes a n– well 412 that is formed in material 410, and an n+ diffusion region 414 which is formed in n– well 412. N-well 412, in turn, is defined to have a lower-plate region 416.

In accordance with the present invention, varactor 400 also includes a p– lightly-doped drain (PLDD) diffusion region 418 that is formed in n-well 412 between n+ diffusion region 414 and lower-plate region 416. As described in greater detail below, PLDD diffusion region 418 increases the size of the depletion region resulting from a negative gate voltage which, in turn, increases the tuning range of varactor 400.

In addition, varactor 400 also includes a layer of gate oxide 420 that is formed on n-well 412 over lower-plate region 416, and an upper-plate gate 422 that is formed on gate oxide layer 420. Further, varactor 400 additionally includes an oxide spacer 424 that is formed over PLDD region 418 to adjoin a side wall of gate 422.

Figure 5:
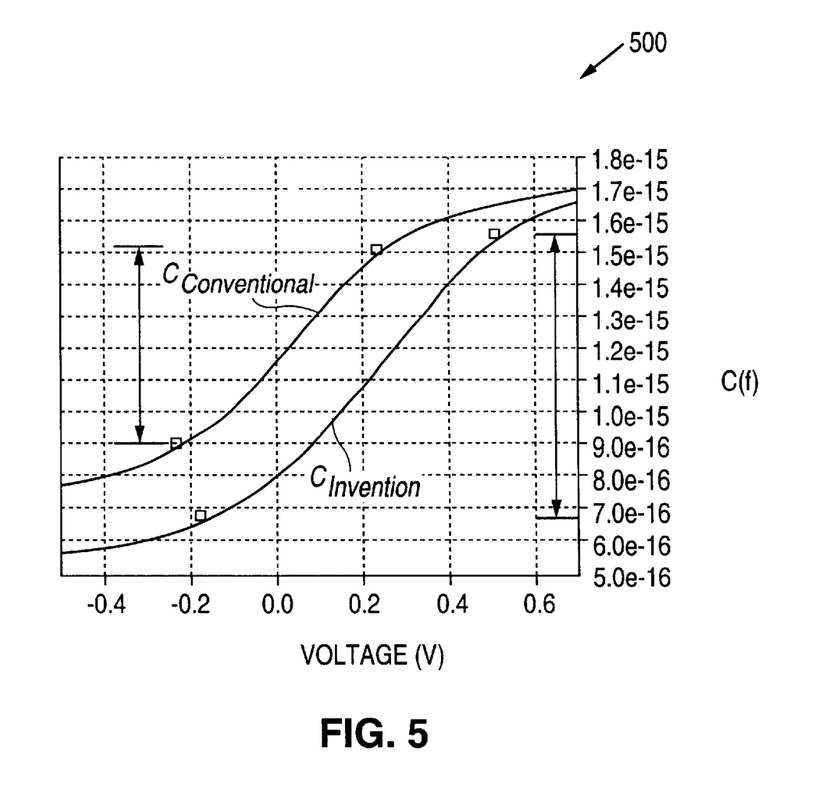
FIG. 5 is a graph 500 illustrating the operation of varactor 400 in accordance with the present invention.

FIG. 5 shows a graph 500 that illustrates the operation of varactor 400 in accordance with the present invention. Graph 500 utilizes a line $C_{INVENTION}$ to identify the capacitance C across varactor 400 for a voltage V across varactor 400. Graph 500 also illustrates line $C_{CONVENTIONAL}$ from FIG. 2 to illustrate the differences between varactor 400 and varactor 100. As with varactor 100, when the voltage V across varactor 400 ranges from a negative value to a positive value, the capacitance C across varactor 400 increases.

In accordance with the present invention, however, varactor 400 has a much larger linear tuning range than varactor 100. For example, when ground is applied to n+ diffusion region 414 and a voltage ranging from –0.19V to +0.5 is applied to gate 422, the capacitance C substantially linearly increases from approximately $6.8 \times 10^{-16}$ farads to approximately $1.55 \times 10^{-15}$ farads.

Thus, as shown in FIG. 5, with respect to the linear tuning range, varactor 400 has a lower linear endpoint of approximately $6.8 \times 10^{-16}$ farads that is substantially less than the lower linear endpoint of approximately $9.0 \times 10^{-16}$ farads of varactor 100. In addition, varactor 400 has an upper linear endpoint at approximately $1.55 \times 10^{-15}$ farads that is slightly higher than the upper linear endpoint of varactor 100 at approximately $1.5 \times 10^{-15}$ farads.

Figure 6A:
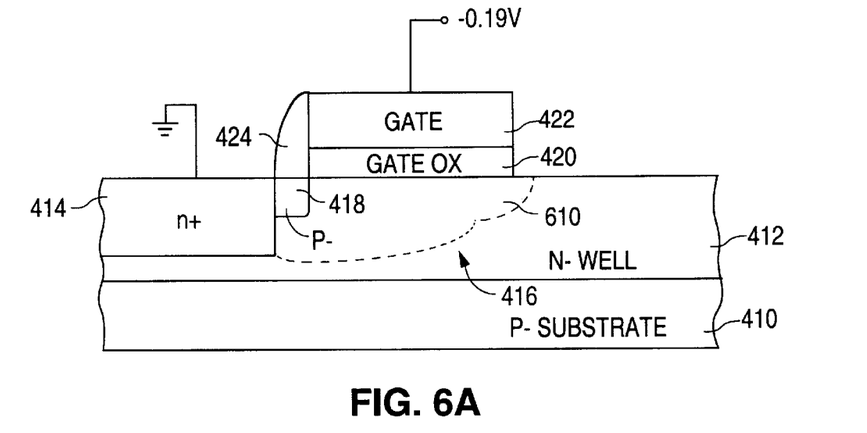
FIGS. 6A–6B are cross-sectional diagrams illustrating the operation of varactor 400 at the linear endpoints in accordance with the present invention.
Figure 6B:
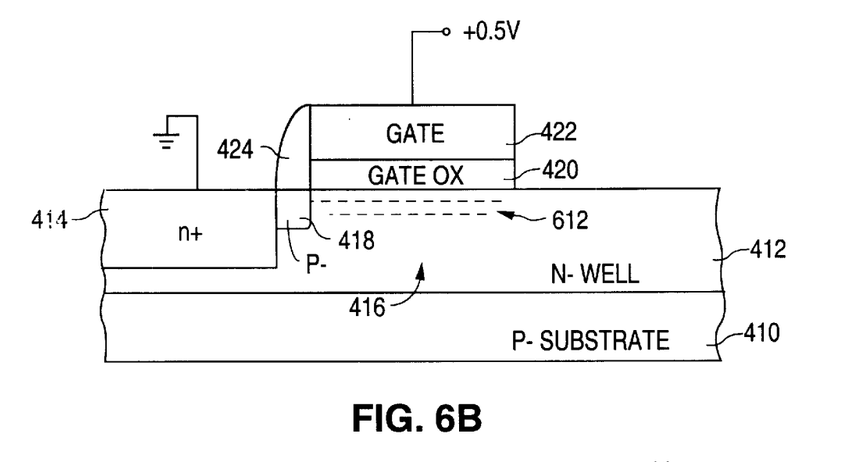

FIGS. 6A–6B show cross-sectional diagrams that illustrate the operation of varactor 400 at the linear endpoints in accordance with the present invention. As shown in FIG. 6A, when ground is applied to n+ diffusion region 414 and the lower linear endpoint of –0.19V is applied to upper-plate gate 422, the negative voltage causes a depletion region 610 to be formed in the lower-plate region 416 of n– well 412.

The capacitance of varactor 400 in this condition is defined by the thickness of gate oxide layer 420 and the charge on lower-plate region 416 which, in turn, is defined by depletion region 610. Depletion region 610 is larger than depletion region 310 because of the presence of PLDD region 418. As a result, the capacitance at the lower linear endpoint of varactor 400 is substantially less than the capacitance at the lower linear endpoint of varactor 100.

As shown in FIG. 6B, when ground is applied to n+ diffusion region 414 and the upper linear endpoint of +0.5V is applied to upper-plate gate 422, the positive voltage causes a negative charge 612 to collect (or accumulate) in the lower-plate region 416 of n– well 412.

The capacitance of varactor 400 in this condition is defined by the thickness of gate oxide layer 420 and the charge on lower-plate region 416 which, in turn, is defined by negative charge 612. PLDD region 418 reduces the value of negative charge 612. However, at the upper endpoint voltages, negative charge 612 is larger than negative charge 312 because varactor 400 responds linearly to a much larger range of gate voltages.

Thus, although PLDD region 418 reduces the value of negative charge 612, an upper endpoint voltage of +0.5V allows slightly more negative charge to accumulate in lower-plate region 416 than can accumulate in lower-plate region 116 of varactor 100 using an upper endpoint voltage of +0.25V. As a result, the capacitance at the upper linear endpoint of varactor 400 is somewhat higher than the capacitance at the upper linear endpoint of varactor 100. Thus, the present invention provides a semiconductor varactor that has a linear tuning range that is substantially larger than the linear tuning range of prior art varactors.

Figure 7:
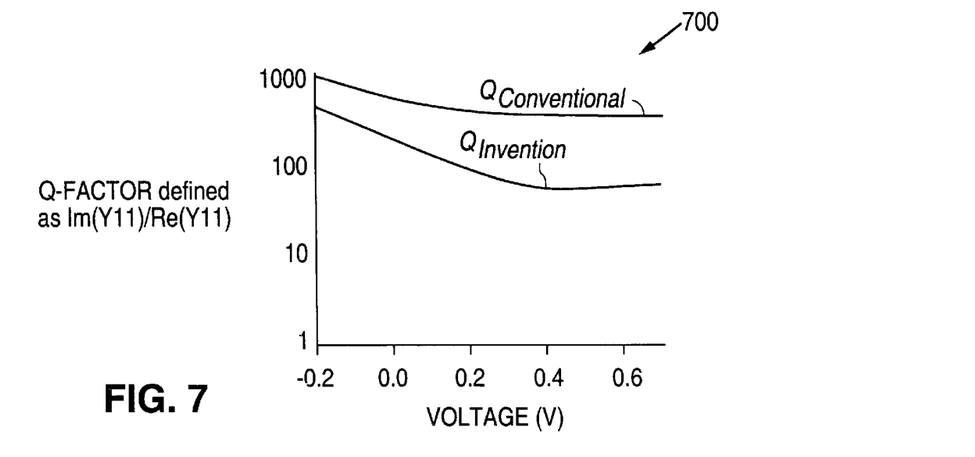
FIG. 7 is a graph 700 further illustrating the operation of varactor 400 in accordance with the present invention.

FIG. 7 shows a graph 700 that further illustrates the operation of varactor 400 in accordance with the present invention. Graph 700 utilizes a line $Q_{INVENTION}$ to identify the quality factor Q of varactor 400 for a range of voltages V across varactor 400 operating at a rate of 5 GHz. (The Q factor is defined as Im(Y11)/Re(Y11).) Graph 700 also utilizes a line $Q_{CONVENTIONAL}$ to identify the quality factor Q of varactor 100 to illustrate the differences between varactor 400 and varactor 100.

As shown in FIG. 7, although the quality factor Q of varactor 400 is less than the quality factor Q of varactor 100, the quality factor Q of varactor 400 is still suitable. Thus, a semiconductor varactor has been described that provides a substantially larger linear tuning range while still maintaining a reasonable quality factor.

The present invention is also easily incorporated into a conventional CMOS or BiCMOS process flow. FIGS. 8A–8G show cross-sectional diagrams that illustrate a method of forming a circuit 800 in accordance with the present invention. Circuit 800, in turn, includes a NMOS transistor, a PMOS transistor, and varactor 400.

Figure 8A:
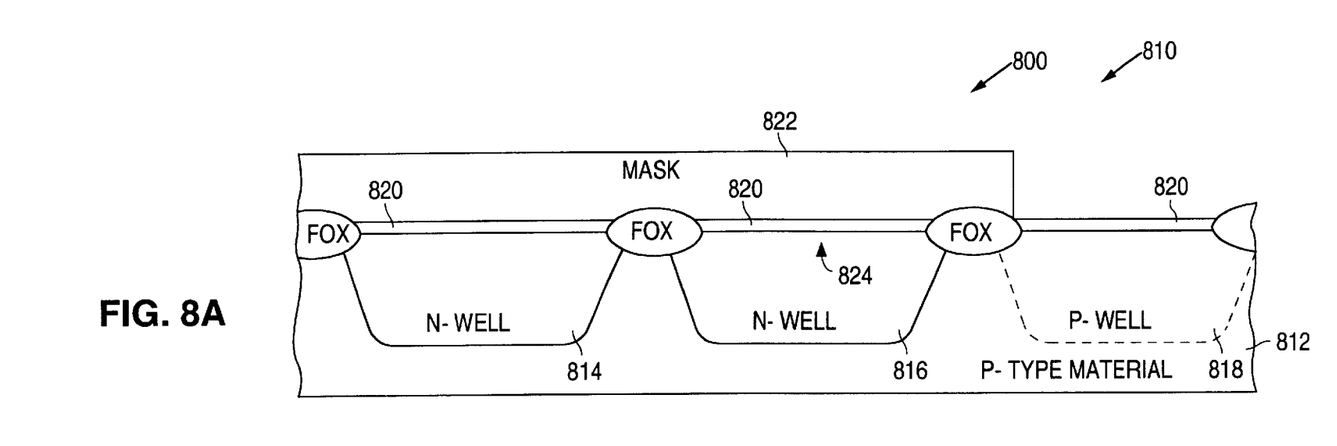
FIGS. 8A–8G are cross-sectional diagrams illustrating a method of forming a circuit 800 in accordance with the present invention.

As shown in FIG. 8A, the process of the present invention utilizes a conventionally formed wafer 810 that includes a p– material 812, such as a substrate or an epitaxial layer, and a n– well 814 that is conventionally formed in material 812. In addition, wafer 810 includes a n– well 816 that is conventionally formed in material 812, and optionally includes a p– well 818 that is formed in material 812.

As described below, the NMOS transistor is formed in p– material 812 or p– well 818, the PMOS transistor is formed in n− well 814, and varactor 400 is formed in n− well 816. In addition, wafer 810 also includes a number of conventionally-formed field oxide regions FOX that are utilized to isolate adjacent regions.

The process of the present invention begins by forming a layer of screen oxide 820 on material 812, followed by the formation and patterning of a NMOS threshold voltage mask 822 on oxide layer 820. Mask 822 is patterned to expose the surface of oxide layer 820 over p− material 812 or p− well 818.

Once threshold voltage mask 822 has been patterned, the exposed region of oxide layer 820 and the underlying region of material 812 (or p− well 818) are implanted with a dopant, such as boron, to set the threshold voltage of the to-be-formed NMOS transistor. Threshold voltage mask 822 is then removed.

Following this, a PMOS threshold voltage mask (not shown) is formed and patterned on oxide layer 820. The PMOS threshold voltage mask is patterned to expose the surface of oxide layer 820 over n-well 814. Once the PMOS threshold voltage mask has been patterned, the exposed regions of oxide layer 820 and the underlying region of n− well 814 are implanted with a dopant, such as boron, to set the threshold voltage of the to-be-formed PMOS transistor. After this, screen oxide layer 820 is removed.

As described, n− well 816 is protected during both threshold voltage implants. Alternately, NMOS threshold voltage mask 822 and/or the PMOS threshold voltage mask can be modified to allow the dopant to be introduced into a lower-plate region 824 (or all) of n-well 816 to vary the dopant concentration of lower-plate region 824.

Figure 8B:
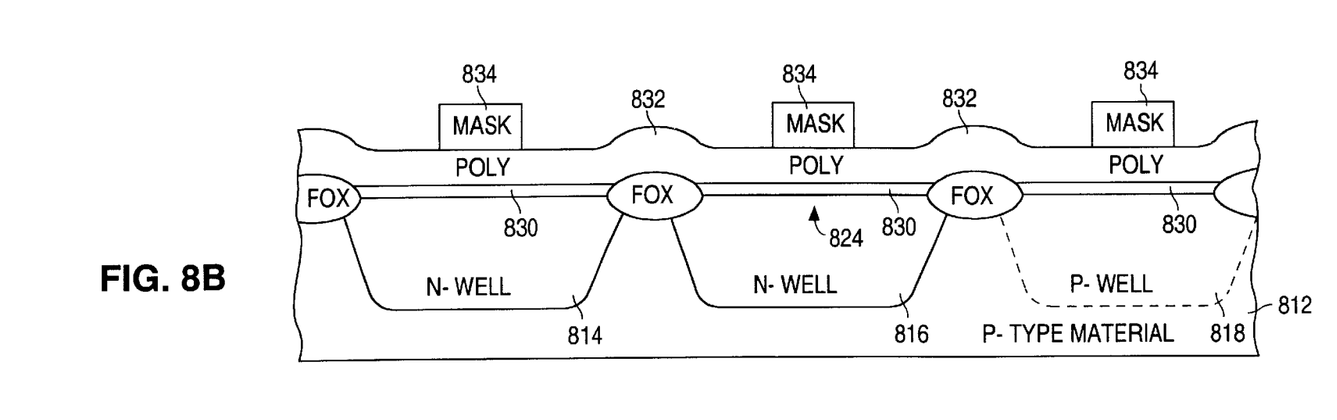

Next, as shown in FIG. 8B, a layer of gate oxide 830 is formed on material 812, followed by the formation of a layer of polysilicon (poly) 832 on gate oxide 830. Poly layer 832 can be formed undoped, with a light p-type dopant concentration, or with a light n-type dopant concentration. Further, additional masking and doping steps can be utilized to form regions of poly layer 832 with specific dopant types and concentrations.

Next, a gate definition mask 834 is formed and patterned on poly layer 832. Gate definition mask 834 is patterned to protect a NMOS gate region of poly layer 832 over material 812 or p− well 818, a PMOS gate region of poly layer 832 over n− well 814, and a varactor gate region of poly layer 832 over n− well 816.

Figure 8C:
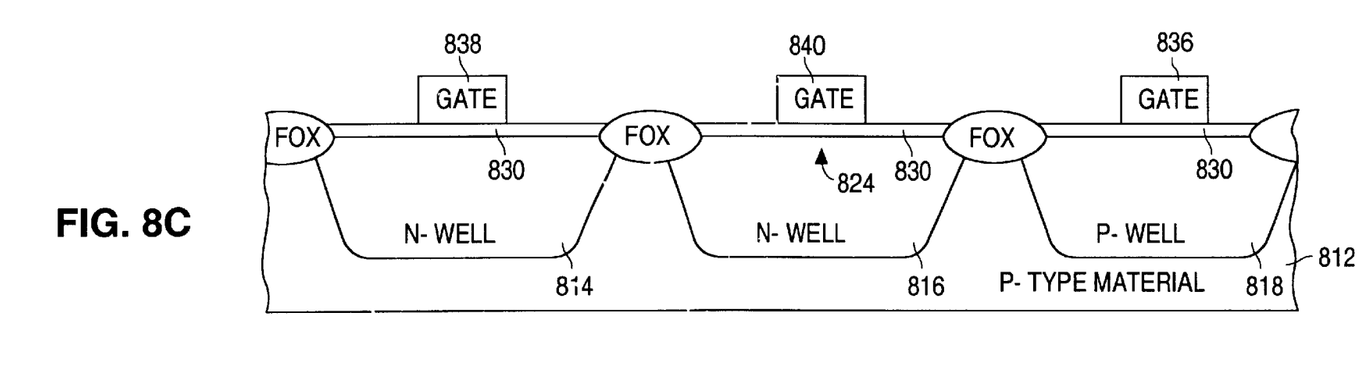

Next, as shown in FIG. 8C, the exposed regions of poly layer 832 are etched until poly layer 832 is removed from the underlying layer of gate oxide 830. The etch forms a NMOS gate 836 of the to-be-formed NMOS transistor over material 812 (or p− well 818), a PMOS gate 838 of the to-be-formed PMOS transistor over n− well 814, and a varactor gate 840 of varactor 400 over n− well 816. Mask 834 is then removed.

Figure 8D:
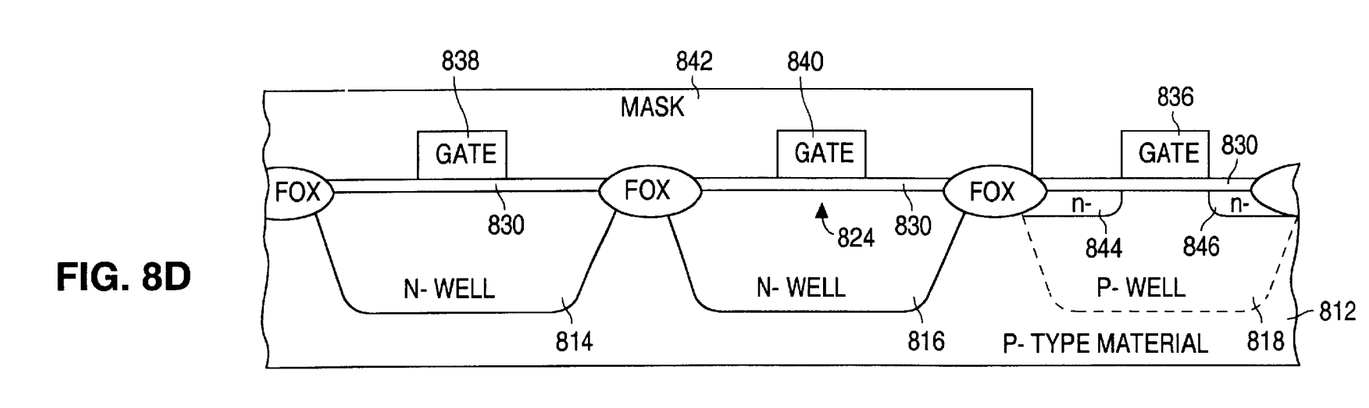

Following this, as shown in FIG. 8D, a first mask 842 is formed and patterned on oxide layer 830 and gates 838 and 840 to expose lightly-doped drain and source regions on oxide layer 830 over material 812 or p− well 818. (Mask 842 can alternately be formed to protect NMOS gate 836. In addition, mask 842 can be formed to expose varactor gate 840.)

Once mask 842 has been patterned, the exposed regions of oxide layer 830 and the underlying region of material 812 (or p− well 818) are implanted with a dopant, such as phosphorous or arsenic. The implant forms a n− drain region 844 and a n− source region 846 in material 812 or p− well 818 on opposite sides of NMOS gate 836. (N− regions 844 and 846 have a dopant concentration equal to a n− lightly-doped drain (NLDD) region.) Mask 842 is then stripped.

Figure 8E:
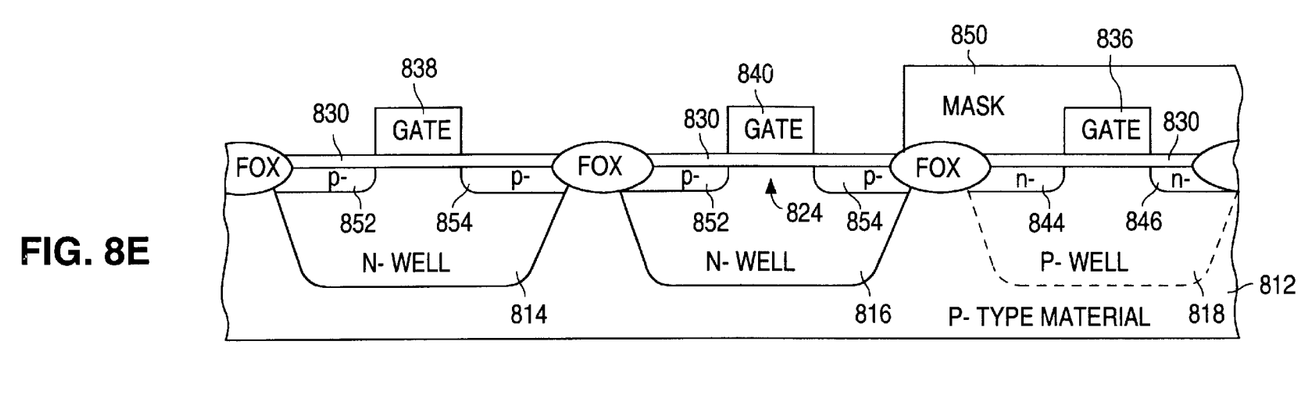

Next, as shown in FIG. 8E, a second mask 850 is formed and patterned on oxide layer 830 and gate 836 to expose lightly-doped drain and source regions on oxide layer 830 over n− well 814 and n− well 816. (Mask 850 can alternately be formed to protect PMOS gate 838. In addition, mask 850 can be formed to protect varactor gate 840.)

Once mask 850 has been patterned, the exposed regions of oxide layer 830 and the underlying regions of n− wells 814 and 816 are implanted with a dopant, such as boron. The implant forms a p− drain region 852 and a p− source region 854 on opposite sides of PMOS gate 838 and varactor gate 840. (P− regions 852 and 854 have a dopant concentration equal to a p− lightly-doped drain (PLDD) region.) Mask 850 is then stripped.

Figure 8F:
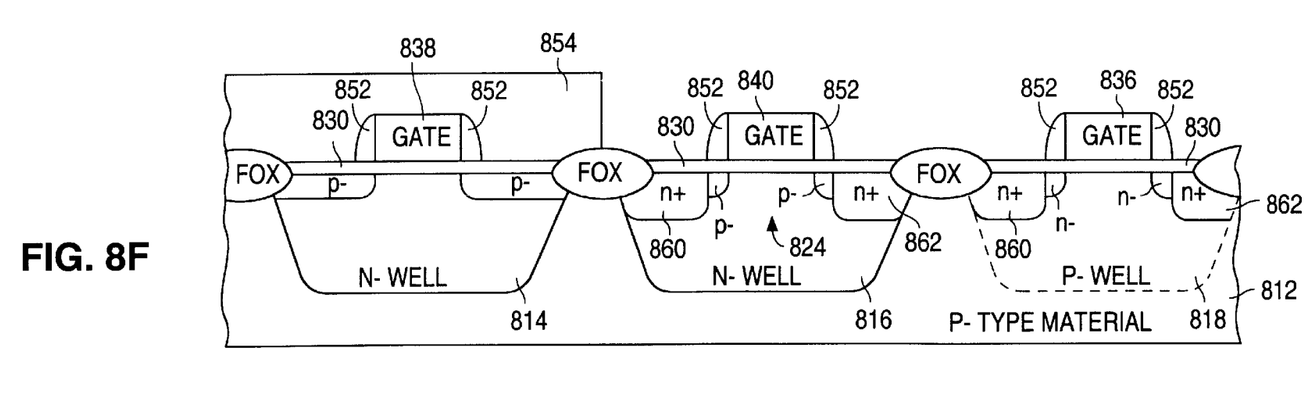

After this, as shown in FIG. 8F, a layer of oxide is deposited on oxide layer 830 and gates 836, 838, and 840, and then anisotropically etched back to form isolation spacers 852. Next, a n+ source and drain mask 854 is formed and patterned on oxide layer 830 and PMOS gate 838 to expose a drain region and a source region on oxide layer 830 over material 812 or p− well 818, and n− well 816. (Mask 854 can be formed to protect NMOS gate 836. In addition, mask 854 can be formed to protect varactor gate 840.)

Once mask 854 has been patterned, the exposed region of oxide layer 830 and the underlying region of material 812 (or p− well 818) and n− well 416 are implanted with a dopant, such as phosphorous or arsenic. The implant forms n+ drain region 860 and n+ source region 862 on opposite sides of NMOS gate 836 and varactor gate 840. Mask 854 is then stripped.

Figure 8G:
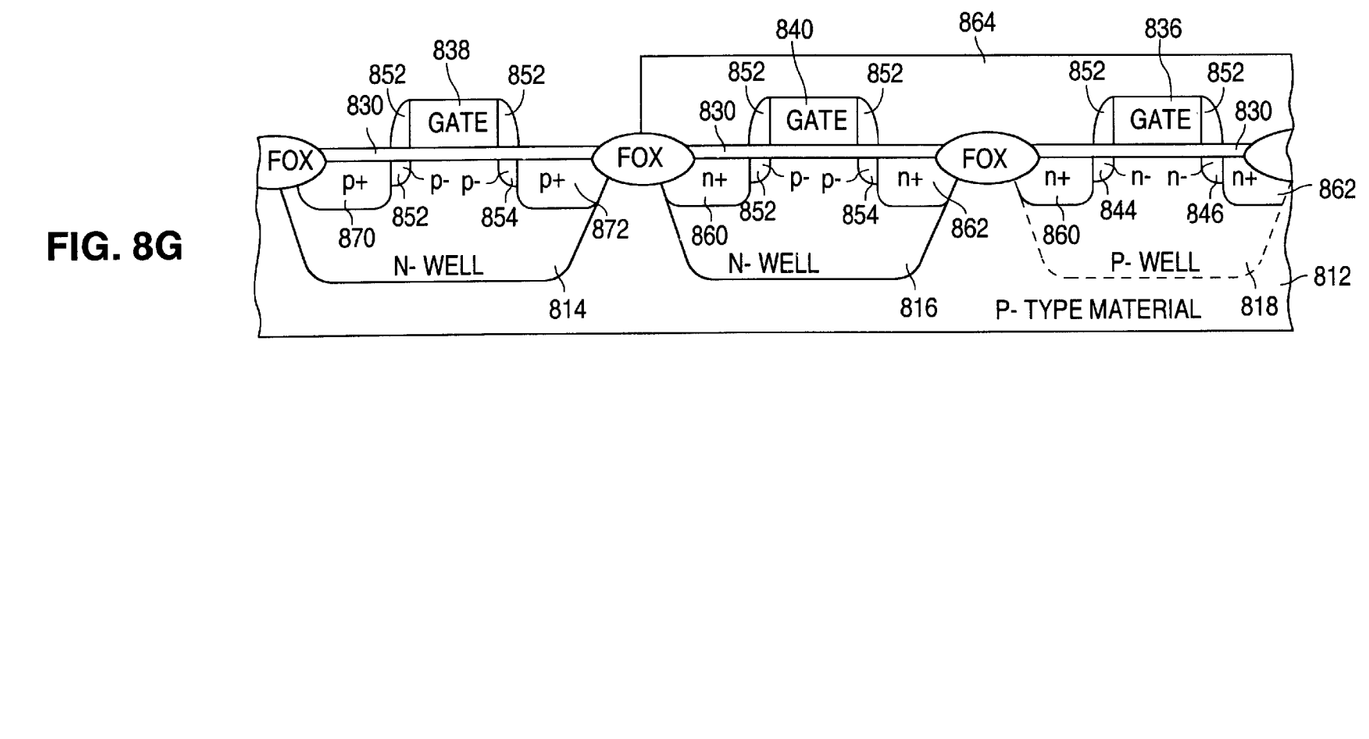

Next, as shown in FIG. 8G, a second source and drain mask 864 is formed and patterned on oxide layer 830, NMOS gate 836, and varactor gate 840 to expose a source region and a drain region on oxide layer 830 over n− well 814. (Mask 864 can alternately be formed to protect PMOS gate 838. In addition, mask 864 can be formed to expose varactor gate 840.)

Once mask 864 has been patterned, the exposed regions of oxide layer 830 and the underlying regions of n− well 814 are implanted with a dopant, such as boron. The implant forms a p+ drain region 870 and a p+ source region 872 on opposite sides of PMOS gate 838. Mask 864 is then stripped. Following this, method 800 continues with conventional steps.

Thus, a method has been described for forming a varactor with an increased tuning range that requires no additional processing steps beyond the steps that are conventionally utilized to form NMOS and PMOS transistors. Varactor 400 is formed using substantially the same steps that are used to form a PMOS transistor, with an exception being that varactor 400 is formed with a n+ diffused region rather than a p+ source/drain region.

As a result, the method of the present invention can be easily integrated into an existing CMOS or BiCMOS fabrication process, requiring only modifications to existing masks. Thus, the present invention provides a method of forming a varactor with an increased tuning range that is easily integratable into existing processes.

It should be understood that various alternatives to the invention described herein may be employed in practicing the invention. For example, although the present invention has been described in terms of an n− well with n+ and p− diffusion regions, the present invention also applies to a p− well with p+ and n− diffusion regions. Thus, it is intended that the following claims define the scope of the invention and that methods and structures within the scope of these claims and their equivalents be covered thereby.

What is claimed is:

1. A varactor comprising:
a first semiconductor material of a first conductivity type, the first semiconductor material having a lower-plate region defined therein;
a first diffusion region of a second conductivity type formed in the first semiconductor material, the first diffusion region adjoining the lower-plate region;
a second diffusion region of the first conductivity type formed in the first semiconductor material, the second diffusion region adjoining the first diffusion region, the second diffusion region having a dopant concentration that is greater than a dopant concentration of the first semiconductor material, the first diffusion region lying between the lower-plate region and the second diffusion region;
a layer of insulation material formed on the first semiconductor material; and
a varactor gate formed on the layer of insulation material over the lower-plate region.

2. A semiconductor circuit comprising: a varactor comprising:
a semiconductor material having a surface and a first conductivity type;
a first region of a second conductivity type formed in the semiconductor material, the first region contacting the surface;
a second region of the first conductivity type formed in the semiconductor material, the second region contacting the surface and the first region, the second region having a dopant concentration;
a layer of insulation material formed on the first semiconductor material; and
a conductive region formed on the layer of insulation material; and
a transistor having:
a second semiconductor material of the first conductivity type, the second semiconductor material having a first channel region defined therein, the layer of insulation material being formed on the second semiconductor material;
first source and drain regions of the second conductivity type formed in the second semiconductor material, the first source and drain regions being on opposite sides of the first channel region, and having a dopant concentration that is substantially equal to a dopant concentration of the first region;
second source and drain regions of the second conductivity type formed in the second semiconductor material, the second source and drain regions being on opposite sides of the first channel region and adjoining the first source and drain regions, respectively, the second source and drain regions having dopant concentrations that are greater than dopant concentrations of the first source and drain regions; and
a first MOS gate formed on the layer of insulation material over the first channel region.

3. The circuit of claim 2 and further comprising a third semiconductor material, the first semiconductor material and the second semiconductor material being wells formed in the third semiconductor material.

4. The circuit of claim 3 wherein the third semiconductor material is a substrate.

5. The circuit of claim 3 wherein the third semiconductor material is an epitaxial layer.

6. The circuit of claim 2 and further comprising:
a second transistor having:
a third semiconductor material of the second conductivity type, the third semiconductor material having a second channel region defined therein, the layer of insulation material being formed on the third semiconductor material;
third source and drain regions of the first conductivity type formed in the third semiconductor material, the third source and drain regions being on opposite sides of the second channel region;
fourth source and drain regions of the first conductivity type formed in the third semiconductor material, the fourth source and drain regions being on opposite sides of the second channel region and adjoining the third source and drain regions, respectively, the fourth source and drain regions having dopant concentrations that are greater than dopant concentrations of the third source and drain regions, and substantially equal to a dopant concentration of the second region; and
a second MOS gate formed on the layer of insulation material over the second channel region.

7. The circuit of claim 6 and further comprising a fourth semiconductor material, the first semiconductor material, the second semiconductor material, and the third semiconductor material being wells formed in the fourth semiconductor material.

8. The circuit of claim 7 wherein the fourth semiconductor material is a substrate.

9. The circuit of claim 7 wherein the fourth semiconductor material is an epitaxial layer.

10. The circuit of claim 6 wherein the third semiconductor material is a substrate, and the first and second semiconductor materials are wells formed in the substrate.

11. The circuit of claim 6 wherein the third semiconductor material is an epitaxial layer, and the first and second semiconductor materials are wells formed in the epitaxial layer.

12. A varactor comprising:
a semiconductor material having a surface and a first conductivity type;
a layer of insulation material formed on the surface of the semiconductor material;
a conductive region having a bottom surface formed on the layer of insulation material, and a side wall surface;
a first region of a second conductivity type formed in the semiconductor material, the first region contacting the surface;
a second region of the first conductivity type formed in the semiconductor material, the second region contacting the surface and the first region, the second region having a dopant concentration; and
a region of the semiconductor material that includes a point, the point contacting both the first region and the surface vertically under the conductive region, the region of semiconductor material having the first conductivity type and a dopant concentration that is less than the dopant concentration of the second region.

13. The varactor of claim 12 wherein the region of the semiconductor material extends from the point to a first location that lies vertically under a center region of the conductive region.

14. The varactor of claim 13 wherein the region of the semiconductor material extends from the point to a second location, the first location lying between the second location and the point.

15. The varactor of claim 12 and further comprising a side wall spacer that contacts the conductive region.

16. The varactor of claim 15 wherein the side wall spacer contacts the side wall surface of the conductive region, substantially all of the first region lying vertically under the side wall spacer.

17. The varactor of claim 15 wherein the side wall spacer contacts the side wall surface of the conductive region, the first region lying vertically under the side wall spacer, substantially none of the second region lying vertically under the side wall spacer.

18. The varactor of claim 12 wherein the semiconductor material is a well formed in a substrate.

19. The varactor of claim 12 wherein the semiconductor material is a well formed in an epitaxial layer.

20. The varactor of claim 12 and further comprising a substrate material of the second conductivity type, the semiconductor material being formed in the substrate material.

21. A varactor comprising:
- a semiconductor material having a surface and a first conductivity type;
- a layer of insulation material formed on the surface of the semiconductor material;
- a conductive region having a bottom surface formed on the layer of insulation material, and a side wall surface;
- a first region of a second conductivity type formed in the semiconductor material, the first region contacting the surface;
- a second region of the first conductivity type formed in the semiconductor material, the second region contacting the surface and the first region, the second region having a dopant concentration greater than a dopant concentration of the semiconductor material; and
- a side wall spacer that contacts the side wall surface of the conductive region.

22. The varactor of claim 21 wherein substantially all of the first region lies vertically under the side wall spacer.

23. A varactor comprising:
- a semiconductor material having a surface and a first conductivity type;
- a layer of insulation material formed on the surface of the semiconductor material;
- a conductive region having a bottom surface formed on the layer of insulation material, and a side wall surface;
- a first region of a second conductivity type formed in the semiconductor material, the first region contacting the surface;
- a second region of the first conductivity type formed in the semiconductor material, the second region contacting the surface and the first region, the second region having a dopant concentration greater than the dopant concentration of the semiconductor material, and lying below and horizontally spaced apart from the conductive region; and
- a side wall spacer that contacts the side wall surface of the conductive region, the first region lying vertically under the side wall spacer.

* * * * *